(12) United States Patent
Huang et al.

(10) Patent No.: US 6,596,088 B2
(45) Date of Patent: Jul. 22, 2003

(54) METHOD FOR REMOVING THE CIRCUMFERENTIAL EDGE OF A DIELECTRIC LAYER

(75) Inventors: Yu-Ling Huang, Chiai (TW); Lung Hui Tsai, Hsinchu (TW)

(73) Assignee: Silicon Integrated Systems Corp. (TW)

( * ) Notice: Subject to any disclaimer, the term of this patent is extended or adjusted under 35 U.S.C. 154(b) by 23 days.

(21) Appl. No.: 09/985,687

(22) Filed: Nov. 5, 2001

(65) Prior Publication Data

US 2003/0084922 A1 May 8, 2003

(51) Int. Cl.[7] .............................. B08B 1/00; B08B 3/02; B08B 5/04
(52) U.S. Cl. .................. 134/6; 134/21; 134/32; 134/33; 134/34; 216/52
(58) Field of Search ........................... 134/6, 7, 21, 32, 134/33, 34; 216/52

(56) References Cited

U.S. PATENT DOCUMENTS 6,117,778 A * 9/2000 Jones et al. ................. 438/692
6,382,292 B1 * 5/2002 Ohmi et al. ................. 156/584

* cited by examiner

*Primary Examiner*—Zeinab El-Arini
(74) *Attorney, Agent, or Firm*—Birch, Stewart, Kolasch & Birch, LLP

(57) ABSTRACT

A method for removing the circumferential edge of a dielectric layer on a semiconductor wafer is disclosed. First, a semiconductor wafer having a dielectric layer on its upper surface is provided. Second, the semiconductor wafer is placed and secured on a susceptor. Third, the circumferential edge of the dielectric layer is removed by a ring cutter. Then, the semiconductor wafer is cleaned from its central portion to its edge portion by water jets.

15 Claims, 5 Drawing Sheets

METHOD FOR REMOVING THE CIRCUMFERENTIAL EDGE OF A DIELECTRIC LAYER

BACKGROUND OF THE INVENTION

1. Field of the Invention

The present invention relates to the manufacture of semiconductor devices, more particularly, to a method for removing the circumferential edge of a dielectric layer to prevent the formation of dielectric particles, which result in contamination of the semiconductor wafer.

2. Description of the Related Art

One of the fabrication steps in the manufacture of integrated circuit devices is to apply a dielectric layer over a semiconductor wafer as an inter-metal-layer or passivation layer. The dielectric layer is in general a silicon-containing glass, such as silicon oxide, borosilicate glass (BSG) phosphosilicate glass (PSG), or borophossilicate glass (BPSG) The dielectric layer located at the circumference of the semiconductor wafer is easily peeled off during subsequent steps such as metal deposition, chemical-mechanical polishing (CMP), or thermal annealing. These peeling dielectric particles can cause contamination of the semiconductor wafer.

FIGS. 1A and 1B are cross-sections respectively showing the semiconductor with a coated dielectric layer and a peeled dielectric layer in accordance with the prior art.

Referring to FIG. 1A, a semiconductor wafer 10 having a dielectric layer 12 on its upper surface is provided.

Next, as shown in FIG. 1B, after a series of subsequent steps, such as thermal process, the dielectric layer 12 located at the edge of the semiconductor wafer 10 is peeled, generating dielectric particles 15. These peeling dielectric particles 15 can cause contamination of the semiconductor wafer. Accordingly, the performance of the semiconductor devices built on the semiconductor wafer will suffer.

SUMMARY OF THE INVENTION

In view of the above disadvantages, an object of the invention is to provide a method for removing the circumferential edge of a dielectric layer on a semiconductor wafer. According to the method, the dielectric particle problem can be eliminated so as to improve the performance of semiconductor devices.

Accordingly, the above objects are attained by providing a method for removing the circumferential edge of a dielectric layer on a semiconductor wafer, comprising the steps of: (a) providing a semiconductor wafer having a dielectric layer on its upper surface; (b) securing the semiconductor wafer on a susceptor; (c) removing the circumferential edge of the dielectric layer by a ring cutter; and (d) cleaning the semiconductor wafer from the central portion to the edge portion of the semiconductor wafer by water jets. The ring cutter preferably has sawteeth. Moreover, a wafer plate or the like can be used to replace the susceptor.

In an embodiment of the invention, the dielectric layer is silicon-containing glass such as silicon oxide, borosilicate glass (BSG), phosphosilicate glass (PSG), borophossilicate glass (BPSG), low dielectric constant material and the like.

Also, to enhance the adhesion between the susceptor and the semiconductor wafer, the susceptor can have sawteeth attaching the lower surface of the semiconductor wafer. It can also be pumped to create a vacuum to fix the position of the wafer.

In another embodiment of the invention, in the method for removing the circumferential edge of a dielectric layer, the circumferential edge of the dielectric layer is preferably removed until the upper surface of the semiconductor wafer is exposed.

In another embodiment of the invention, in the method for removing the circumferential edge of a dielectric layer, the susceptor can be rotatable susceptor.

Furthermore, the above objects are also attained by providing a method for removing the circumferential edge of a dielectric layer on a semiconductor wafer, comprising providing a semiconductor wafer having a dielectric layer on its upper surface, and then removing the circumferential edge of the dielectric layer with a cutter.

BRIEF DESCRIPTION OF THE DRAWINGS

FIGS. 2A' and 2B' are perspective views showing the method for removing the circumferential edge of a dielectric layer on a semiconductor wafer according to the first embodiment of the invention.

DETAILED DESCRIPTION OF THE PREFERRED EMBODIMENTS

The following description will explain the method for removing the circumferential edge of a dielectric layer according to the preferred embodiments of the invention, which proceeds with reference to the accompanying drawings.

First Embodiment

Figure 1A:
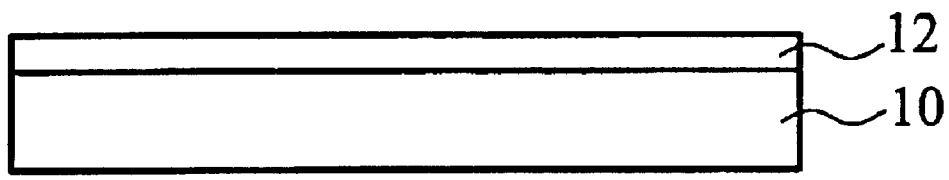
FIGS. 1A and 1B are cross-sections respectively showing the semiconductor with a coated dielectric layer and a peeled dielectric layer in accordance with the prior art.
Figure 1B:
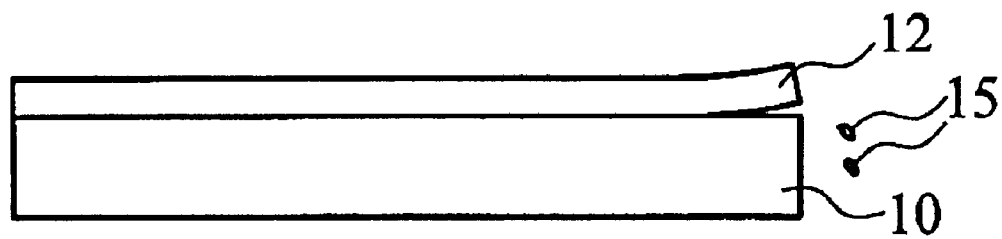
Figure 2A:
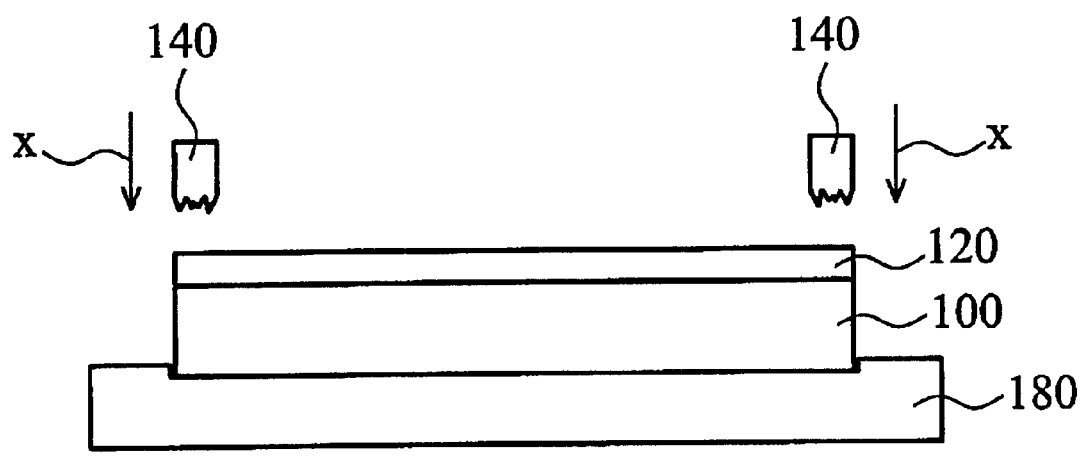
FIGS. 2A and 2B are cross-sections showing the method for removing the circumferential edge of a dielectric layer on a semiconductor wafer according to the first embodiment of the invention.

FIGS. 2A (2A') and 2B (2B') are cross-sections (perspective views) showing the method for removing the circumferential edge of a dielectric layer on a semiconductor wafer according to the first embodiment of the invention.

As shown in FIGS. 2A and 2A', an 8-inch semiconductor wafer 100 having a dielectric layer 120, such as a silicon-containing glass layer, on its upper surface is provided. The silicon-containing layer preferably comprises silicon oxide, borosilicate glass (BSG), phosphosilicate glass (PSG), or borophossilicate glass (BPSG). Further, the semiconductor wafer 100 is placed and secured on a susceptor 180 capable of clamping the semiconductor wafer 100.

Figure 2B:
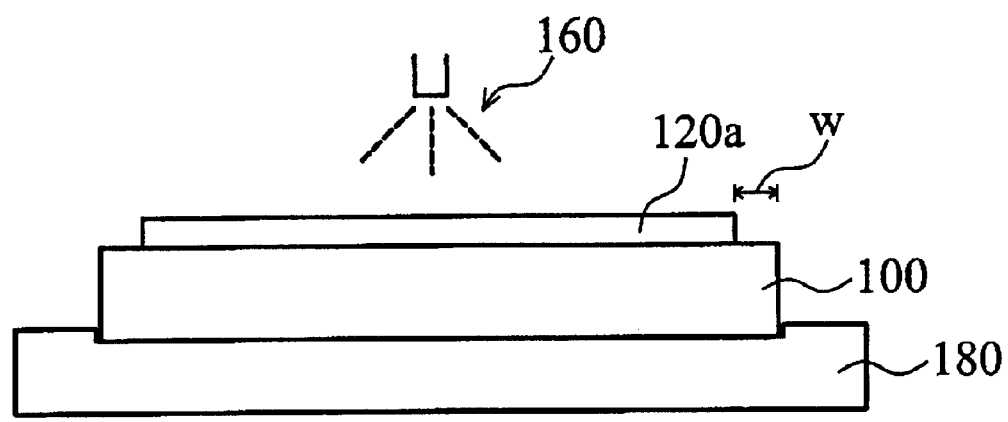
Figure 2A:
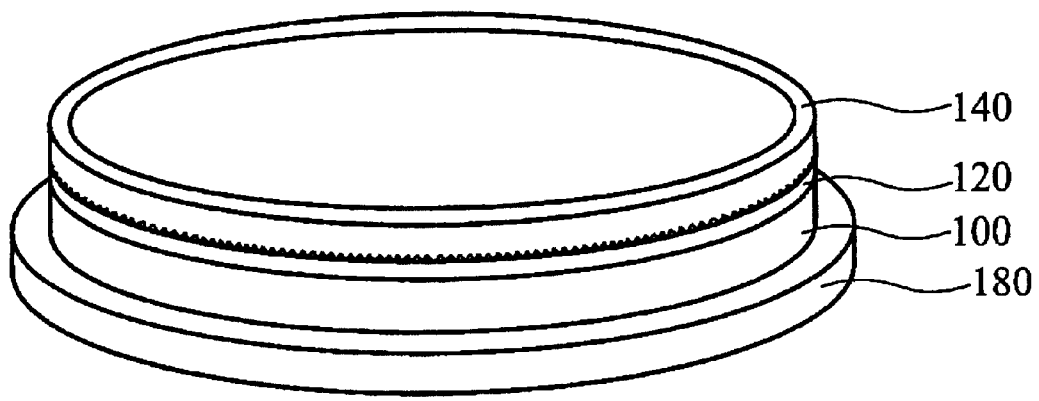
Figure 2B:
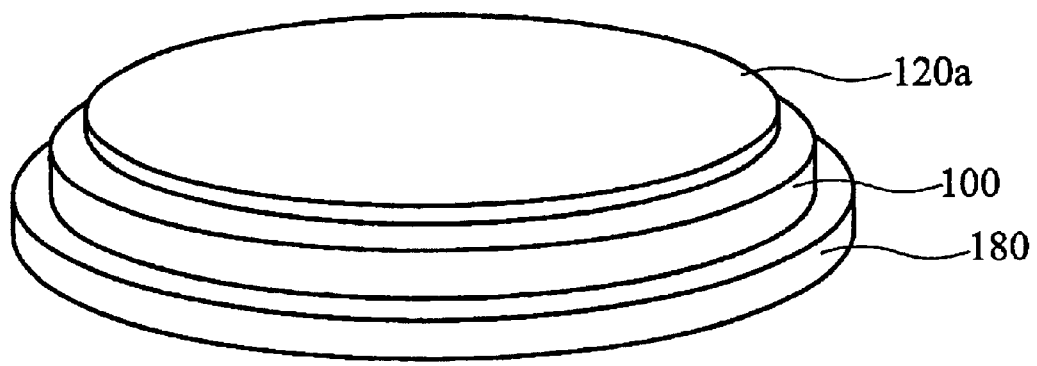

Next, ring cutter 140 is used to move in the direction of arrow X to remove the circumferential edge, about 5 mm~10 mm width W, of the dielectric layer 120 thereby leaving the central dielectric layer 120a depicted as FIGS. 2B and 2B'. In this step, the edge surface of the semiconductor wafer 100 is preferably exposed. Moreover, the ring cutter 140 has preferably sawteeth.

Afterward, purified water 260 is applied from a fluid jet system (not shown) to clean the semiconductor wafer 100 from the central portion to the edge portion of the semiconductor wafer 100 so that the dielectric material and impurities are completely removed.

Second Embodiment

Figure 3A:
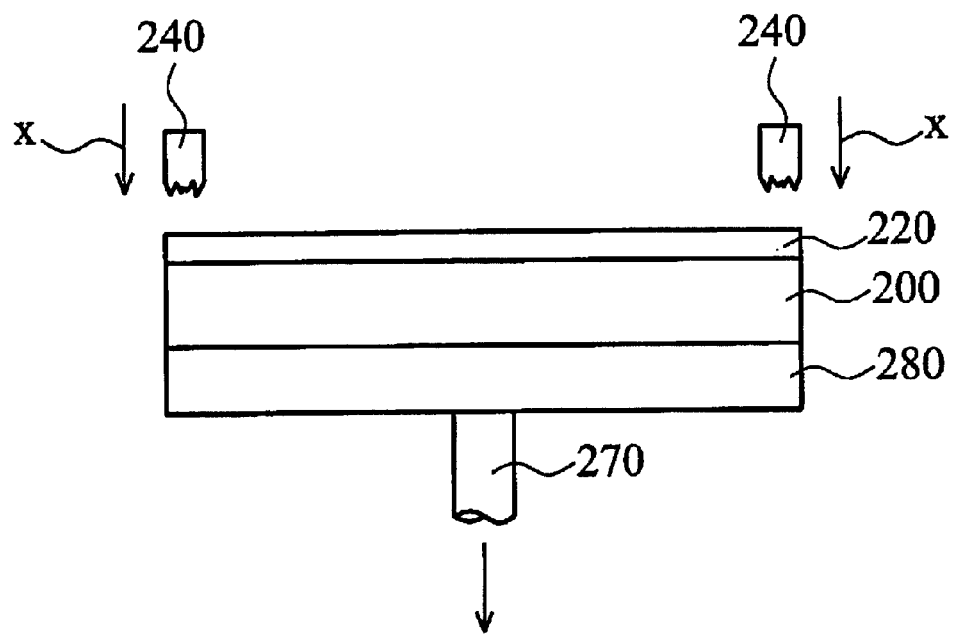
FIGS. 3A and 3B are cross-sections showing the method for removing the circumferential edge of a dielectric layer on a semiconductor wafer according to the second embodiment of the invention.
Figure 3B:
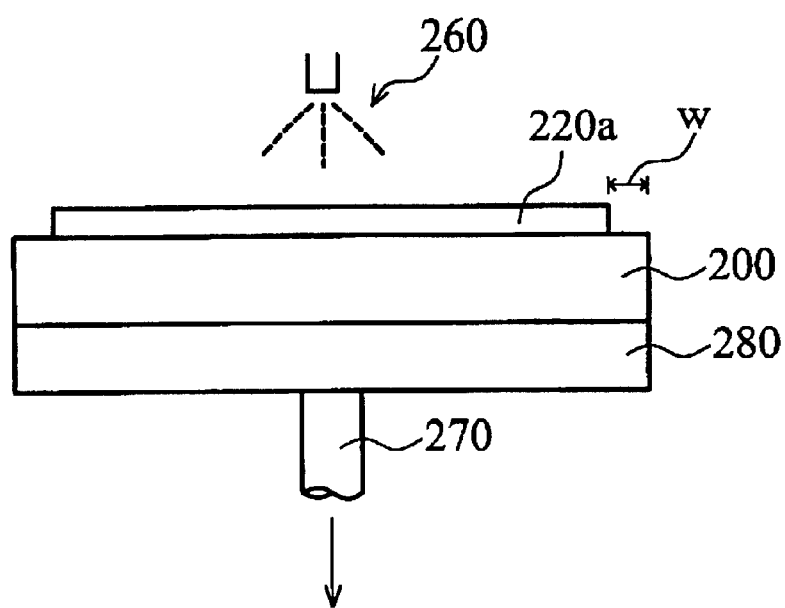

FIGS. 3A and 3B are cross-sections showing the method for removing the circumferential edge of a dielectric layer on a semiconductor wafer according to the second embodiment of the invention.

As shown in FIG. 3A, an 8-inch semiconductor wafer 200 having a dielectric layer 220, such as a silicon-containing glass layer, on its upper surface is provided. The semiconductor wafer 200 is placed and secured on a susceptor 280 capable of fitting the semiconductor wafer 200. In this embodiment, the susceptor 280 is connected to a vacuum pumping system (not shown) by a conduit 270 for adhesion of the semiconductor wafer 200 thereof.

Next, a ring cutter 240 is used to move in the direction of arrow X to remove the circumferential edge, about 5 mm~10 mm width W, of the dielectric layer 220 thereby leaving the central dielectric layer 220a depicted as FIG. 3B. In this step, the edge surface of the semiconductor wafer 200 is preferably exposed. Moreover, the ring cutter 240 has sawteeth.

Afterward, purified water 260 is applied from a fluid jet system (not shown) to clean the semiconductor wafer 200 from its central portion to its edge portion so that the dielectric material and impurities are completely removed.

Third Embodiment

Figure 4A:
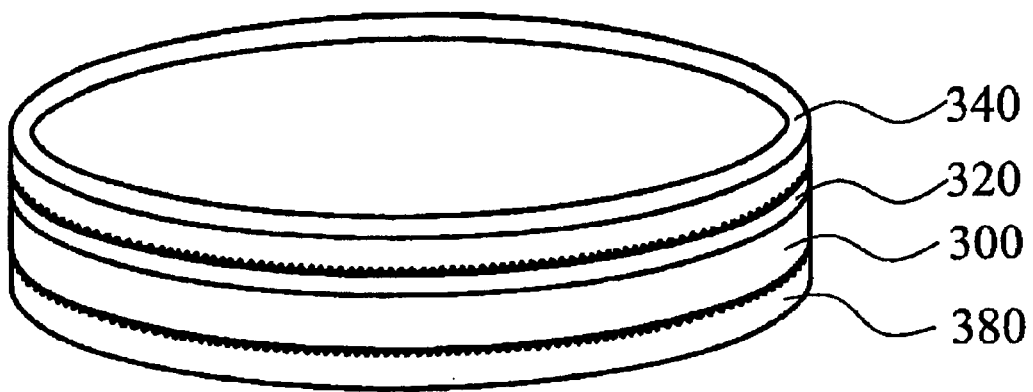
FIGS. 4A and 4B are perspective views showing the method for removing the circumferential edge of a dielectric layer on a semiconductor wafer according to the third embodiment of the invention.
Figure 4B:
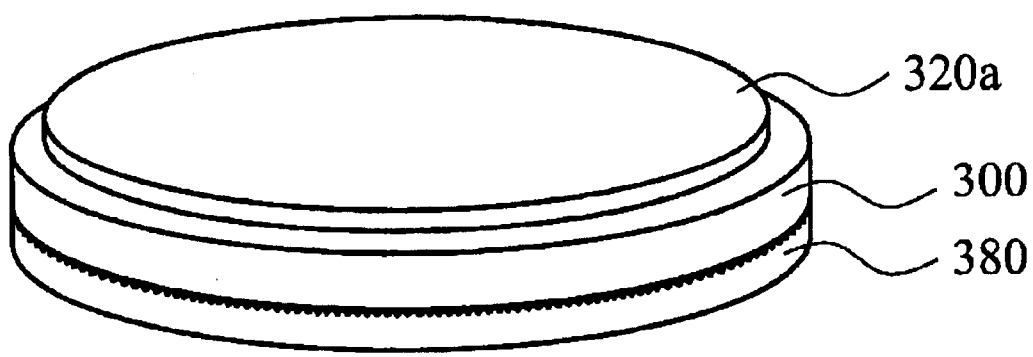

FIGS. 4A and 4B are perspective views showing the method for removing the circumferential edge of a dielectric layer on a semiconductor wafer according to the third embodiment of the invention.

As shown in FIG. 4A, an 8-inch semiconductor wafer 300 having a dielectric layer 320, such as a silicon-containing glass layer, on its upper surface is provided. The semiconductor wafer 300 is placed and secured on a susceptor 380 capable of fitting the semiconductor wafer 300. In this embodiment, the semiconductor wafer 300 is fixed by a susceptor 380, which is a ring support with sawteeth attaching the lower surface of the semiconductor wafer 300.

Next, ring cutter 340 is used to remove the circumferential edge of the dielectric layer 320 thereby leaving the central dielectric layer 320a depicted as FIG. 4B. In this step, the edge surface of the semiconductor wafer 300 is preferably exposed. Moreover, the ring cutter 340 also has sawteeth.

As in the other embodiments, purified water (not shown) is applied to clean the semiconductor wafer 300 from its central portion to its edge portion so that the dielectric material and impurities are completely removed.

According to the embodiments of the invention, the dielectric particle problem can be eliminated so as to improve the performance of semiconductor devices.

While the invention has been described with reference to various illustrative embodiments, the description is not intended to be construed in a limiting sense. Various modifications of the illustrative embodiments, as well as other embodiments of the invention, will be apparent to those person skilled in the art upon reference to this description. It is therefore contemplated that the appended claims will cover any such modifications or embodiments as may fall within the scope of the invention defined by the following claims and their equivalents.

What is claimed is:

1. A method for removing the circumferential edge of a dielectric layer on a semiconductor wafer, comprising the steps of:

(a) providing a semiconductor wafer having a dielectric layer on its upper surface;

(b) securing the semiconductor wafer on a susceptor;

(c) removing the circumferential edge of the dielectric layer by a ring cutter; and (d) cleaning the semiconductor wafer from its central portion to its edge portion by water jets.

2. The method for removing the circumferential edge of a dielectric layer according to claim 1, wherein the dielectric layer is silicon-containing glass.

3. The method for removing the circumferential edge of a dielectric layer according to claim 2, wherein the silicon-containing glass is selected from the group consisting of silicon oxide, borosilicate glass (BSG), phosphosilicate glass (PSG), and borophossilicate glass (BPSG).

4. The method for removing the circumferential edge of a dielectric layer according to claim 1, wherein the susceptor is a ring support with sawteeth attaching a lower surface of the semiconductor wafer.

5. The method for removing the circumferential edge of a dielectric layer according to claim 1, wherein the susceptor is equipped with a vacuum.

6. The method for removing the circumferential edge of a dielectric layer according to claim 1, wherein the ring cutter has sawteeth.

7. The method for removing the circumferential edge of a dielectric layer according to claim 1, wherein the circumferential edge of the dielectric layer is removed until the semiconductor wafer is exposed.

8. A method for removing the circumferential edge of a dielectric layer on a semiconductor wafer, comprising the steps of:

(a) providing a semiconductor wafer having a dielectric layer on its upper surface; and (b) removing the circumferential edge of the dielectric layer by a cutter.

9. The method for removing the circumferential edge of a dielectric layer according to claim 8, wherein the dielectric layer is silicon-containing glass.

10. The method for removing the circumferential edge of a dielectric layer according to claim 9, wherein the silicon-containing glass is selected from the group consisting of silicon oxide, borosilicate glass (BSG), phosphosilicate glass (PSG), and borophossilicate glass (BPSG).

11. The method for removing the circumferential edge of a dielectric layer according to claim 8, wherein the cutter is ring-shaped.

12. The method for removing the circumferential edge of a dielectric layer according to claim 11, wherein the cutter has sawteeth.

13. The method for removing the circumferential edge of a dielectric layer according to claim 8, wherein the circumferential edge of the dielectric layer is removed until the semiconductor wafer is exposed.

14. The method for removing the circumferential edge of a dielectric layer according to claim 8, wherein after step (b) the semiconductor wafer is cleaned from a central portion to an edge portion by water jets.

15. The method for removing the circumferential edge of a dielectric layer according to claim 8, wherein after step (a) the semiconductor wafer is secured on a rotatable susceptor.

* * * * *